US012581881B2

(12) United States Patent　　(10) Patent No.:　US 12,581,881 B2
Takasaki et al.　　　　　　　　　(45) Date of Patent:　　Mar. 17, 2026

(54) PLASMA PROCESSING METHOD

(71) Applicant: Hitachi High-Tech Corporation, Tokyo (JP)

(72) Inventors: Koichi Takasaki, Tokyo (JP); Makoto Miura, Tokyo (JP); Makoto Satake, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 220 days.

(21) Appl. No.: 18/026,171

(22) PCT Filed: Mar. 7, 2022

(86) PCT No.: PCT/JP2022/009641
　　§ 371 (c)(1),
　　(2) Date: Mar. 14, 2023

(87) PCT Pub. No.: WO2023/170732
　　PCT Pub. Date: Sep. 14, 2023

(65) Prior Publication Data
　　US 2024/0304456 A1　　Sep. 12, 2024

(51) Int. Cl.
　　*H01L 21/3213*　　(2006.01)
　　*H01J 37/32*　　　(2006.01)
　　*H10D 30/67*　　　(2025.01)

(52) U.S. Cl.
　　CPC .... *H01L 21/32136* (2013.01); *H01J 37/3211* (2013.01); *H01J 37/32651* (2013.01); *H01J 2237/3341* (2013.01); *H01J 2237/3346* (2013.01); *H10D 30/6735* (2025.01)

(58) Field of Classification Search
None
See application file for complete search history.

(56) References Cited

U.S. PATENT DOCUMENTS

| | | | |
|---|---|---|---|
| 2,981,287 | A | 4/1961 | Caslow |
| 3,452,781 | A | 7/1969 | Napolitano |
| 3,760,843 | A | 9/1973 | Larner |
| 4,450,031 | A | 5/1984 | Ono et al. |
| 4,638,837 | A | 1/1987 | Buike et al. |
| 4,669,404 | A | 6/1987 | Yoneda |

(Continued)

FOREIGN PATENT DOCUMENTS

| | | | |
|---|---|---|---|
| JP | H62-014429 A | 1/1987 |
| JP | H02-230729 A | 9/1990 |

(Continued)

OTHER PUBLICATIONS

Office Action mailed Apr. 12, 2024 in Korean Application No. 10-2023-7004561.

(Continued)

*Primary Examiner* — Stephanie P Duclair

(74) *Attorney, Agent, or Firm* — Miles & Stockbridge, P.C.

(57) ABSTRACT

An object of the present invention is to provide a highly controllable plasma processing method capable of selectively removing a metal-containing layer. In the plasma processing method for plasma etching a metal-containing film formed on a formed pattern and covered with a carbon-containing film, after the carbon-containing film is removed, the metal-containing film is removed by etching with radicals generated from plasma.

10 Claims, 11 Drawing Sheets

(56) References Cited

U.S. PATENT DOCUMENTS

| | | |
|---|---|---|
| 4,844,767 A | 7/1989 | Okudaira et al. |
| 4,960,073 A | 10/1990 | Suzuki et al. |
| 5,178,962 A | 1/1993 | Miyamoto et al. |
| 5,195,045 A | 3/1993 | Keane et al. |
| 5,284,544 A | 2/1994 | Mizutani et al. |
| 5,712,592 A | 1/1998 | Stimson et al. |
| 5,770,922 A | 6/1998 | Gerrish et al. |
| 5,992,460 A | 11/1999 | Akimoto |
| 5,998,986 A | 12/1999 | Ido |
| 6,082,406 A | 7/2000 | Williamson, Jr. et al. |
| 6,145,541 A | 11/2000 | Hirota |
| 6,162,323 A | 12/2000 | Koshimizu |
| 6,192,937 B1 | 2/2001 | Fagerlie et al. |
| 6,265,831 B1 | 7/2001 | Howald et al. |
| 6,270,618 B1 | 8/2001 | Nakano et al. |
| 6,287,980 B1 | 9/2001 | Hanazaki et al. |
| 6,351,683 B1 | 2/2002 | Johnson et al. |
| 6,551,447 B1 | 4/2003 | Savas et al. |
| RE38,273 E | 10/2003 | Gerrish et al. |
| 6,677,711 B2 | 1/2004 | MacGearailt |
| 6,867,086 B1 | 3/2005 | Chen et al. |
| 6,919,689 B2 | 7/2005 | Jafarian-Tehrani et al. |
| 7,084,832 B2 | 8/2006 | Pribyl |
| 7,190,119 B2 | 3/2007 | Patrick et al. |
| 7,645,357 B2 | 1/2010 | Paterson et al. |
| 8,038,896 B2 | 10/2011 | Ikegami et al. |
| 8,546,266 B2 | 10/2013 | Mori et al. |
| 9,431,268 B2 | 8/2016 | Lill et al. |
| 9,548,228 B2 | 1/2017 | Chandrashekar et al. |
| 9,761,491 B1 | 9/2017 | Huang et al. |
| 9,947,804 B1* | 4/2018 | Frougier ............ H10D 30/6743 |
| 9,978,610 B2 | 5/2018 | Fung et al. |
| 10,121,686 B2 | 11/2018 | Ogawa et al. |
| 2001/0022293 A1 | 9/2001 | Maeda et al. |
| 2002/0106845 A1 | 8/2002 | Chao et al. |
| 2002/0123229 A1 | 9/2002 | Ono et al. |
| 2003/0212507 A1 | 11/2003 | Wei et al. |
| 2004/0129671 A1 | 7/2004 | Ji et al. |
| 2004/0185670 A1 | 9/2004 | Hamelin et al. |
| 2006/0037704 A1 | 2/2006 | Iwata et al. |
| 2006/0048892 A1 | 3/2006 | Arase et al. |
| 2006/0049429 A1 | 3/2006 | Kim et al. |
| 2006/0288934 A1 | 12/2006 | Takahashi et al. |
| 2007/0044716 A1 | 3/2007 | Tetsuka et al. |
| 2007/0163477 A1 | 7/2007 | Nagata et al. |
| 2007/0286967 A1 | 12/2007 | Ide et al. |
| 2008/0110400 A1 | 5/2008 | Satou et al. |
| 2008/0128087 A1 | 6/2008 | Hayano et al. |
| 2008/0190893 A1 | 8/2008 | Mori et al. |
| 2008/0268645 A1 | 10/2008 | Kao et al. |
| 2008/0277062 A1 | 11/2008 | Koshimizu et al. |
| 2009/0023296 A1 | 1/2009 | Nishizuka |
| 2009/0029564 A1 | 1/2009 | Yamashita et al. |
| 2010/0173493 A1 | 7/2010 | Kushibiki et al. |
| 2010/0258529 A1 | 10/2010 | Mori et al. |
| 2011/0061811 A1 | 3/2011 | Toru et al. |
| 2011/0062417 A1 | 3/2011 | Masayoshi et al. |
| 2011/0120649 A1 | 5/2011 | Satou et al. |
| 2011/0297533 A1 | 12/2011 | Mori et al. |
| 2012/0064726 A1 | 3/2012 | Nozawa et al. |
| 2012/0222751 A1 | 9/2012 | Okabe |
| 2012/0231553 A1 | 9/2012 | Okita et al. |
| 2012/0255617 A1 | 10/2012 | Miyazoe et al. |
| 2013/0228550 A1 | 9/2013 | Mori et al. |
| 2013/0270625 A1 | 10/2013 | Jang et al. |
| 2013/0319615 A1 | 12/2013 | Cho et al. |
| 2014/0020831 A1 | 1/2014 | Ohgoshi et al. |
| 2014/0057447 A1 | 2/2014 | Yang et al. |
| 2014/0091435 A1 | 4/2014 | Chan et al. |
| 2014/0102640 A1 | 4/2014 | Yokogawa et al. |
| 2014/0134842 A1 | 5/2014 | Zhang et al. |
| 2014/0225503 A1 | 8/2014 | Mori et al. |
| 2014/0262034 A1 | 9/2014 | Ishibashi et al. |
| 2015/0011093 A1 | 1/2015 | Singh et al. |
| 2015/0072533 A1 | 3/2015 | Muraki et al. |

| | | |
|---|---|---|
| 2015/0083582 A1 | 3/2015 | Dhindsa et al. |
| 2015/0179464 A1 | 6/2015 | Wang et al. |
| 2015/0262829 A1 | 9/2015 | Park et al. |
| 2015/0270148 A1 | 9/2015 | Shinoda et al. |
| 2015/0330519 A1 | 11/2015 | Maurer et al. |
| 2015/0357210 A1 | 12/2015 | Mori et al. |
| 2016/0035585 A1 | 2/2016 | Xiang et al. |
| 2016/0133530 A1 | 5/2016 | Sonoda et al. |
| 2016/0177443 A1 | 6/2016 | Kumar et al. |
| 2016/0379857 A1 | 12/2016 | Ogawa et al. |
| 2017/0053810 A1 | 2/2017 | Yang et al. |
| 2017/0053915 A1* | 2/2017 | Ando ............... H01L 21/28255 |
| 2017/0101713 A1 | 4/2017 | Wang et al. |
| 2017/0194166 A1 | 7/2017 | Tan et al. |
| 2017/0229314 A1 | 8/2017 | Tan et al. |
| 2017/0250290 A1 | 8/2017 | Chang et al. |
| 2017/0309719 A1 | 10/2017 | Sun et al. |
| 2018/0047595 A1* | 2/2018 | Kofuji .................. H01J 37/3211 |
| 2018/0144948 A1 | 5/2018 | Maruyama et al. |
| 2018/0151346 A1 | 5/2018 | Blanquart |
| 2018/0211824 A1 | 7/2018 | Kudo et al. |
| 2018/0308768 A1 | 10/2018 | Mochizuki et al. |
| 2019/0067032 A1 | 2/2019 | Shinoda et al. |
| 2021/0082766 A1 | 3/2021 | Miura et al. |
| 2021/0242030 A1 | 8/2021 | Shinoda et al. |
| 2021/0265349 A1 | 8/2021 | Chung et al. |
| 2022/0165732 A1 | 5/2022 | Khaderbad et al. |

FOREIGN PATENT DOCUMENTS

| | | |
|---|---|---|
| JP | H03-218018 A | 9/1991 |
| JP | H04-180621 A | 6/1992 |
| JP | H04-225226 A | 8/1992 |
| JP | H05-007763 A | 1/1993 |
| JP | H05-234947 A | 9/1993 |
| JP | H06-045326 A | 2/1994 |
| JP | H06-077184 A | 3/1994 |
| JP | H07-254606 A | 10/1995 |
| JP | H08-107101 A | 4/1996 |
| JP | H11-185998 A | 7/1999 |
| JP | 2000-091321 A | 3/2000 |
| JP | 2000-306884 A | 11/2000 |
| JP | 2001-085342 A | 3/2001 |
| JP | 2001-085542 A | 7/2001 |
| JP | 2001-319882 A | 11/2001 |
| JP | 2002-343766 A | 11/2002 |
| JP | 2002343768 A | 11/2002 |
| JP | 2003-047278 A | 12/2003 |
| JP | 2005-259839 A | 9/2005 |
| JP | 2006-066905 A | 3/2006 |
| JP | 2006-080519 A | 3/2006 |
| JP | 2006-086449 A | 3/2006 |
| JP | 2007-059567 A | 3/2007 |
| JP | 2008-124190 A | 5/2008 |
| JP | 2008-244146 A | 10/2008 |
| JP | 2009-111330 A | 5/2009 |
| JP | 2011-066151 A | 3/2011 |
| JP | 2011-082180 A | 4/2011 |
| JP | 2013-214583 A | 10/2013 |
| JP | 2013-251546 A | 12/2013 |
| JP | 2014-075578 A | 4/2014 |
| JP | 2014-229751 A | 12/2014 |
| JP | 2015-050362 A | 3/2015 |
| JP | 2015-065434 A | 4/2015 |
| JP | 2015-188025 A | 10/2015 |
| JP | 2016-051846 A | 4/2016 |
| JP | 2016-139792 A | 8/2016 |
| JP | 2016-145412 A | 8/2016 |
| JP | 2016-207771 A | 12/2016 |
| JP | 2017-063186 A | 3/2017 |
| JP | 2017-183688 A | 10/2017 |
| JP | 2018-093226 A | 6/2018 |
| JP | 2018-533207 A | 11/2018 |
| JP | 2019-040932 A | 3/2019 |
| JP | 2019-515494 A | 6/2019 |
| KR | 10-2005-0099723 A | 10/2005 |
| KR | 10-2008-0086172 A | 9/2008 |
| KR | 10-2010-0012875 A | 2/2010 |
| KR | 10-1596329 B1 | 2/2016 |

(56) References Cited

FOREIGN PATENT DOCUMENTS

| | | | |
|---|---|---|---|
| KR | 10-2017-0101952 | A | 9/2017 |
| KR | 10-2017-0108916 | A | 9/2017 |
| KR | 10-2018-0060983 | A | 6/2018 |
| KR | 10-2021-0109412 | A | 9/2021 |
| TW | 544805 | | 8/2003 |
| TW | 200620454 | A | 6/2006 |
| TW | 200802592 | A | 1/2008 |
| TW | 200829087 | A | 7/2008 |
| TW | 201234474 | A | 8/2012 |
| TW | 201417172 | A | 5/2014 |
| TW | 201428848 | A | 7/2014 |
| TW | 201517162 | A | 5/2015 |
| TW | 201533796 | A | 9/2015 |
| WO | 2005104203 | A1 | 11/2005 |
| WO | 2013101007 | A1 | 7/2013 |
| WO | 2015119385 | A1 | 8/2015 |
| WO | 2016121075 | A1 | 8/2016 |
| WO | 2016190036 | A1 | 12/2016 |
| WO | 2019116827 | A1 | 6/2019 |
| WO | 2020217266 | A1 | 10/2020 |
| WO | 2021048995 | A1 | 3/2021 |

OTHER PUBLICATIONS

Search Report mailed May 17, 2022 in International Application No. PCT/JP2022/009641.

Notice of Allowance mailed Feb. 16, 2022 in U.S. Appl. No. 16/216,455.

Office Action mailed Apr. 2, 2021 in U.S. Appl. No. 15/558,005.

Office Action mailed Apr. 29, 2021 in U.S. Appl. No. 16/216,455.

Office Action mailed Aug. 24, 2020 in U.S. Appl. No. 15/558,005.

Office Action mailed Dec. 9, 2019 in Korean Application No. 10-2018-0157894.

Office Action mailed Feb. 23, 2018 in Taiwanese Application No. 106123071.

Office Action mailed Feb. 7, 2020 in U.S. Appl. No. 15/558,005.

Office Action mailed Jul. 21, 2020 in Japanese Application No. 2019-124995.

Office Action mailed Jun. 14, 2019 in U.S. Appl. No. 15/558,005.

Office Action mailed Mar. 5, 2019 in Japanese Application No. 2018-037128.

Office Action mailed Nov. 30, 2022 in U.S. Appl. No. 15/558,005.

Office Action mailed May 12, 2022 in U.S. Appl. No. 15/558,005.

Office Action mailed Oct. 15, 2021 in U.S. Appl. No. 15/558,005.

Office Action mailed Nov. 26, 2018 in U.S. Appl. No. 15/558,005.

Notice of Allowance mailed Aug. 27, 2021 in U.S. Appl. No. 16/646,057.

Office Action mailed May 11, 2021 in U.S. Appl. No. 16/646,057.

Office Action mailed Apr. 20, 2021 in Japan Application No. 2020-509124.

Patrick Verdonck, et al., "Analysis of the Etching Mechanisms of Tungsten in Fluorine Containing Plasmas", Journal of Electrochemical Society, vol. 142, No. 6, pp. 1971-1976 (1995).

Search Report mailed Jul. 16, 2019 in International Application No. PCT/JP2019/016930.

Office Action mailed Sep. 26, 2018 in Taiwanese Application No. 107106284.

Office Action mailed Jul. 13, 2018 in Korean Application No. 10-2014-0013325.

Office Action mailed Jul. 13, 2018 in Korean Application No. 10-2015-0053111.

Office Action mailed Aug. 9, 2016 in Japanese Application No. 2013-112562.

Office Action mailed Jan. 15, 2016 in Taiwanese Application No. 10520049730.

Office Action mailed Jan. 19, 2015 in Korean Application No. 10-2014-0013325.

STIC Search Report mailed Oct. 7, 2014 in U.S. Appl. No. 14/177,251.

Search Report mailed Apr. 6, 2021 in International Application No. PCT/JP2021/004592.

Written Opinion mailed Apr. 6, 2021 in International Application No. PCT/JP2021/004592.

Office Action mailed May 6, 2022 in Taiwanese Application No. 111104241.

P. Weckx et al., "Stacked nanosheet fork architecture for SRAM design and device co-optimization toward 3nm", Proceedings of IEDM 2017, pp. 505-508.

Search Report mailed Dec. 3, 2019 in International Application No. PCT/JP2019/035998.

Office Action mailed Feb. 25, 2022 in Korean Application No. 10-2020-7017074.

Office Action mailed Sep. 28, 2018 in Taiwanese Application No. 106123071.

* cited by examiner

PLASMA PROCESSING METHOD

TECHNICAL FIELD

The present invention relates to a plasma processing method.

BACKGROUND ART

In recent years, a demand for power saving and high speed semiconductor devices has increased from the market, and a tendency of a device structure to become more complicated and highly integrated is remarkable. For example, in logic devices, the application of FETs with a GAA (Gate All Around) structure in which channels are configured with stacked nanowires or nanosheets is under consideration. In the etching process of the GAA-FET, in addition to vertical processing for fin formation, isotropic processing for nanowire or nanosheet formation is required.

In a process of manufacturing the semiconductor devices, it is required to cope with the complication of the semiconductor devices as described above. A plasma etching device used in the semiconductor device processing, taking the GAA-FET processing as an example, requires both of a function of performing anisotropic etching by irradiating both ions and radicals, and a function of irradiating only neutral particles such as radicals to perform isotropic etching.

For example, PTL 1 proposes a device in which a shield plate that shields the incidence of ions is installed in a chamber, and plasma is generated below the shield plate to perform plasma processing that irradiates both ions and radicals, or in which radical-only processing can be performed by generating a plasma above the shield plate.

PTL 2 proposes a plasma processing method for removing portions of a film other than the film embedded in a pattern formed on side walls of a hole or a trench by plasma etching, in which after the film on a bottom surface of the hole or trench is removed, the film perpendicular to a depth direction of the hole or trench is removed.

In addition, PTL 3 proposes a method of adjusting a size of an opening of a depositing step of depositing a CF-based deposit on a side surface of the opening in order to meet a demand for miniaturization of semiconductor devices.

CITATION LIST

Patent Literature

PTL 1: Japanese Patent Application Unexamined Publication No. 2018-93226
PTL 2: WO 2016/190036
PTL 3: Japanese Patent Application Unexamined Publication No. 2009-111330

SUMMARY OF INVENTION

Technical Problem

In recent years, a trend toward more complex and highly integrated device structures has become more pronounced. For example, in the etching process of the GAA-FET, in order to stably create an intended structure, as disclosed in PTL 2, a technique in which after removing the film on the bottom of the hole or trench, the film in a direction perpendicular to the depth direction of the hole or the trench is removed, or the adjustment of the opening size by the CF-based deposition disclosed in PTL 3 alone is not enough, and it is desirable that only a metal gate (work function metal) film in the depth direction (second direction) of the hole or the groove, or only a metal gate (work function metal) film in a direction (first direction) perpendicular to the depth direction (second direction) of the hole or the groove can be removed.

An object of the present invention is to provide a highly controllable plasma processing method capable of selectively removing a metal-containing layer.

More specifically, another object of the present invention is to provide a highly controllable plasma processing method capable of removing only a metal gate (work function metal) film in a depth direction of a hole or a groove, or only a metal gate (work function metal) film in a direction perpendicular to the depth direction of the hole or the groove.

Solution to Problem

In order to solve the above problems, according to one of representative plasma processing methods according to the present invention, there is provided a plasma processing method for plasma etching a metal-containing film formed on a formed pattern and covered with a carbon-containing film, in which the metal-containing film is removed by etching with radicals generated from plasma after removal of the carbon-containing film.

Advantageous Effects of Invention

According to the present invention, after removing the carbon-containing layer, radical etching allows selective removal of a first layer of the metal-containing layer. Therefore, there can be provided a plasma processing method with high controllability in order to stably create a desired structure of devices that are becoming more complex and highly integrated.

BRIEF DESCRIPTION OF DRAWINGS

FIG. 1C is a diagram showing an example of a cross-sectional shape of the sample in the plasma processing method according to Example 1 of the present invention.

DESCRIPTION OF EMBODIMENTS

Figure 1A:
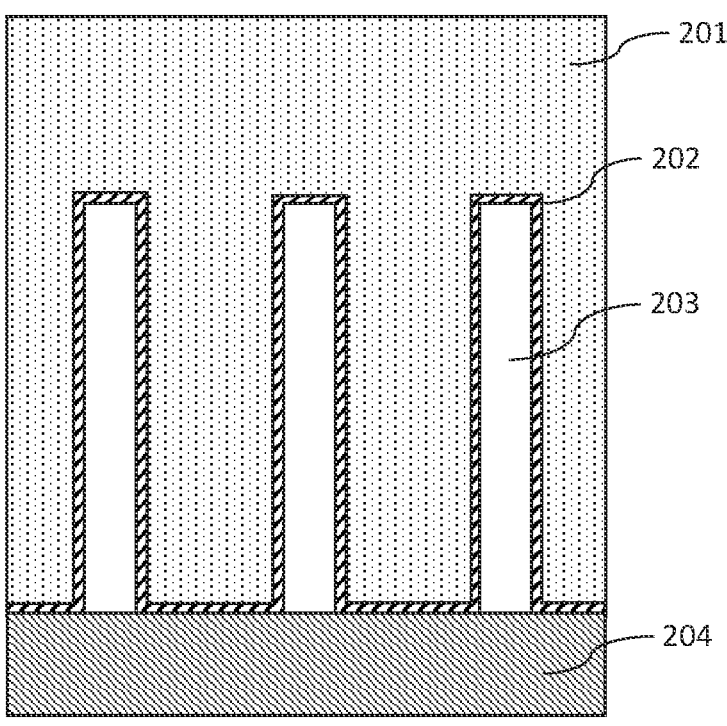
FIG. 1A is a diagram showing an example of a cross-sectional shape of a sample in a plasma processing method according to Example 1 of the present invention.

Embodiments will be described below with reference to the drawings. However, in the following description, the same reference numerals may be given to the same components, and repetitive descriptions may be omitted. In order to make the description clearer, the drawings may be represented schematically in comparison with actual embodiments, but those drawings are only examples and do not limit the interpretation of the present invention.

First Embodiment (Example 1)

Figure 1B:
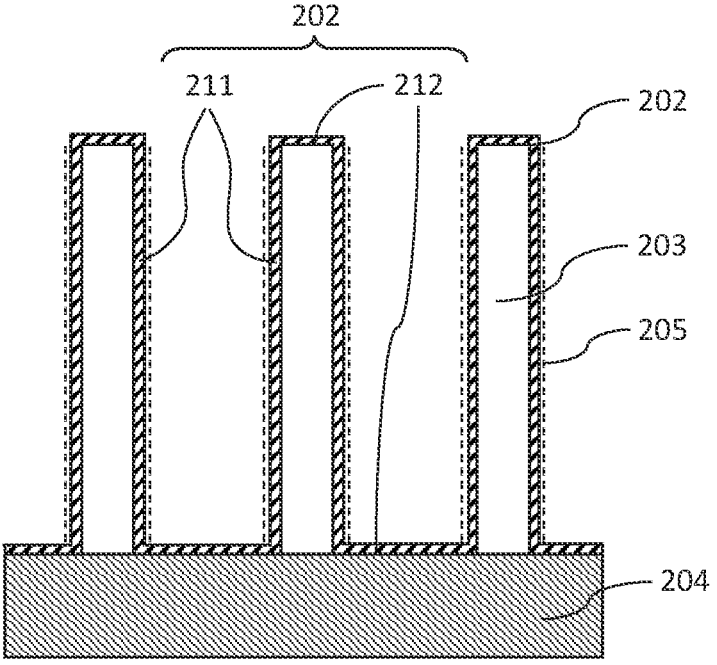
FIG. 1B is a diagram showing an example of a cross-sectional shape of the sample in the plasma processing method according to Example 1 of the present invention.
Figure 1C:
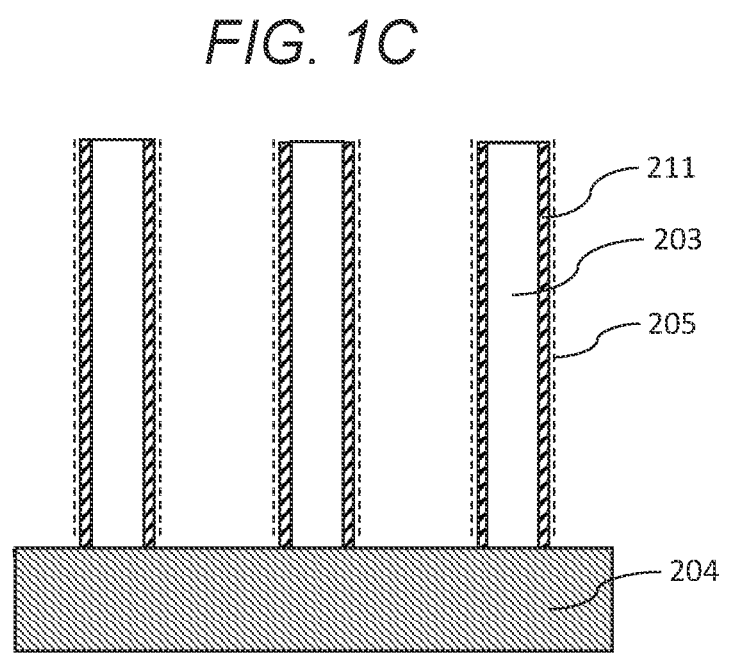

FIGS. 1A to 1C are diagrams showing examples of cross-sectional shapes of a sample in a plasma processing method according to Example 1 of the present invention. The sample shown in FIG. 1A is, for example, a semiconductor wafer, and includes a base layer 204 made of Si (silicon) or SiOx (silicon oxide), multiple pillar structures 203 made of Si, SiN (silicon nitride), SiOx, etc., a hard metal layer (metal-containing layer or metal-containing film) 202 made of TiN (titanium nitride), TaN (tantalum nitride, tantalum nitride), TiO (titanium oxide), AlO (aluminum oxide), etc., and a carbon-containing layer (also called carbon-containing material or carbon-containing film) 201. The metal-containing layer 202 includes Ti (titanium), Ta (tantalum), Al (aluminum), Co (cobalt), Ru (ruthenium), Cu (copper), Mo (molybdenum), In (indium), TiN (titanium nitride, titanium nitride), TaN (tantalum nitride, tantalum nitride), TiO (titanium oxide), or AlO (aluminum oxide).

In this example, the hard metal layer (metal-containing layer) 202 includes a first layer 212 formed in a first direction and a second layer 212 formed in a second direction crossing the first direction, as shown in FIG. 1B.

As an example, a width of the columns along the first direction of the pillar structures 203 is 40 nm, a distance between the columns along the first direction of the pillar structures 203 is 80 nm, and a height of the columns along the second direction of the pillar structures 203 is 200 nm. In this example, when the carbon-containing layer 201 is removed by reactive ion etching (RIE) using a gas system mainly containing Ar (argon), $N_2$ (nitrogen), and $H_2$ (hydrogen), the hard metal layer 202 is exposed. At this time, a very small amount of redeposition 205 of the removed carbon-containing layer is deposited on a side wall of the hard metal layer 202 (hard metal layer 211 in the second direction) (FIG. 1B). In this case, for example, if weak etching without ion assist such as radical etching is performed using a gas system mainly containing $Cl_2$ (chlorine), a structure can be formed in which the side wall of the hard metal layer 202 is inhibited from being etched by redeposition 205 of the carbon-containing layer, and the rest, that is, only the first layer 212 of the hard metal layer 202 in the horizontal direction (corresponding to the first direction) with respect to the surface of the base layer 204 is selectively removed, and only the second layer 211 of the hard metal layer 202 in a direction (corresponding to the second direction) perpendicular to the surface of the base layer 204 is selectively left (FIG. 1C). In this example, reactive ion etching (RIE) means etching using ions and radicals generated from plasma. Radical etching means etching by radicals generated from plasma.

The first embodiment can be summarized as follows. That is, the first embodiment provides a plasma processing method in which the metal-containing film (202: 212, 211) formed on the formed pattern (the pattern of the pillar structures 203) and covered with the carbon-containing film (201) is plasma-etched, and after removal of the film (201), the metal-containing film (first layer 212) is removed by radical etching.

As described above, the redeposition (205) during etching of the carbon-containing layer 201 and the radical etching are appropriately utilized so that only the first layer 212 of the hard metal layer 202 in a direction horizontal to the surface of the base layer 204 can be selectively removed.

Second Embodiment (Example 2)

Figure 2A:
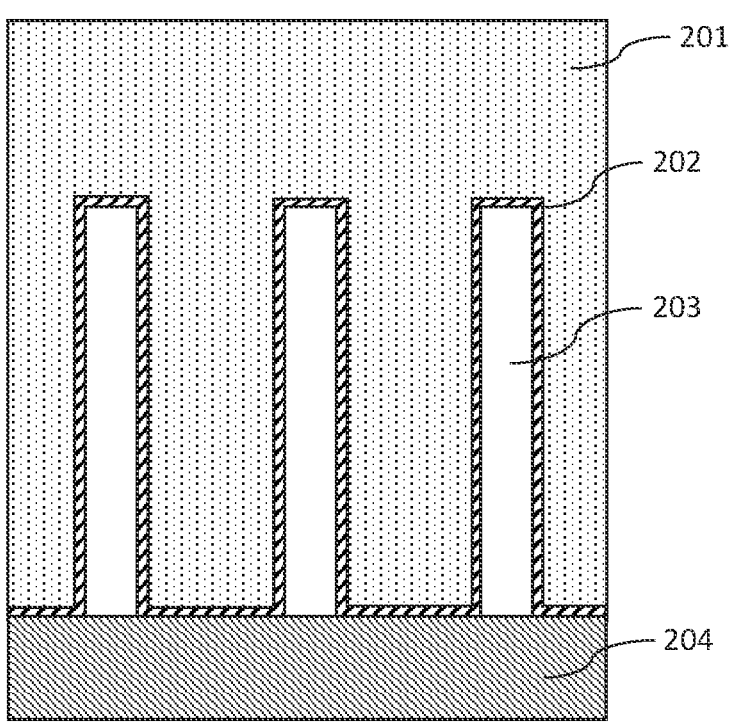
FIG. 2A is a diagram showing an example of a cross-sectional shape of a sample in a plasma processing method according to Example 2 of the present invention.
Figure 2B:
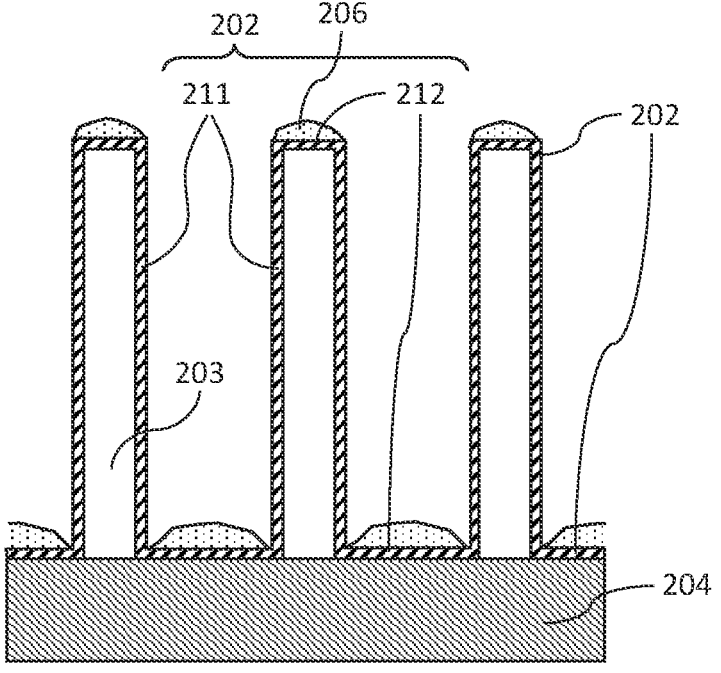
FIG. 2B is a diagram showing an example of a cross-sectional shape of the sample in the plasma processing method according to Example 2 of the present invention.

FIGS. 2A to 2D are diagrams showing examples of cross-sectional shapes of a sample in a plasma processing method according to Example 2 of the present invention. The sample shown in FIG. 2A includes a base layer 204 made of Si or SiOx, pillar structures 203 made of Si, SiN, SiOx, etc., and a hard metal layer (metal-containing layer or metal-containing film) 202 made of TiN, TaN, TiO, AlO, or similar materials, and a carbon-containing layer (carbon-containing film) 201. As an example, a width of the columns is 40 nm, a distance between the columns is 80 nm, and a height of the columns is 200 nm. In this case, for example, if the carbon-containing layer 201 is removed by reactive ion etching (RIE) using a gas system mainly containing Ar, $N_2$, and $H_2$, the hard metal layer 202 becomes exposed. In this case, for example, with the use of a gas system mainly containing $CHF_3$ (trifluoromethane) and He (helium), a thin film deposition process is performed by highly anisotropic deposition, and a thin film deposition film (also called a thin film deposition layer) 206 is deposited on only a layer (first layer 212) horizontal to the surface of the base layer 204 of the hard metal layer 202 (FIG. 2B). On the other hand, the deposition film 206 does not adhere to the layer (second layer 211) perpendicular to the surface of the base layer 204 of the hard metal layer 202.

Figure 2C:
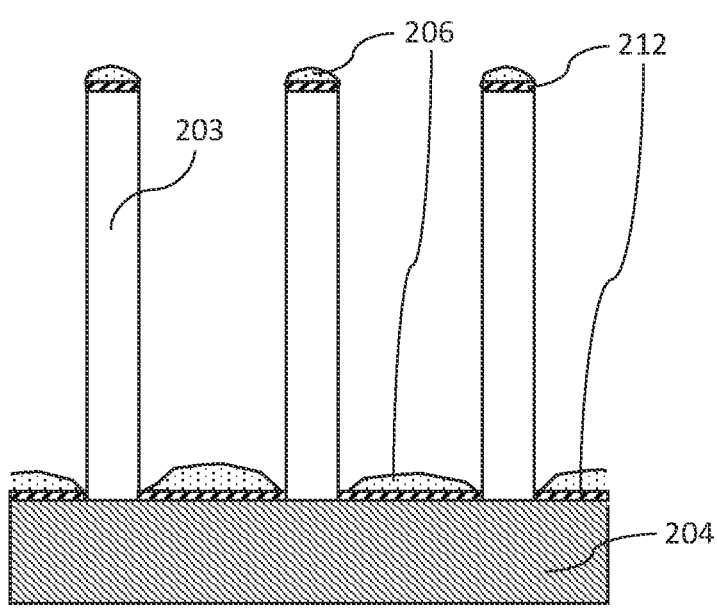
FIG. 2C is a diagram showing an example of a cross-sectional shape of the sample in the plasma processing method according to Example 2 of the present invention.
Figure 2D:
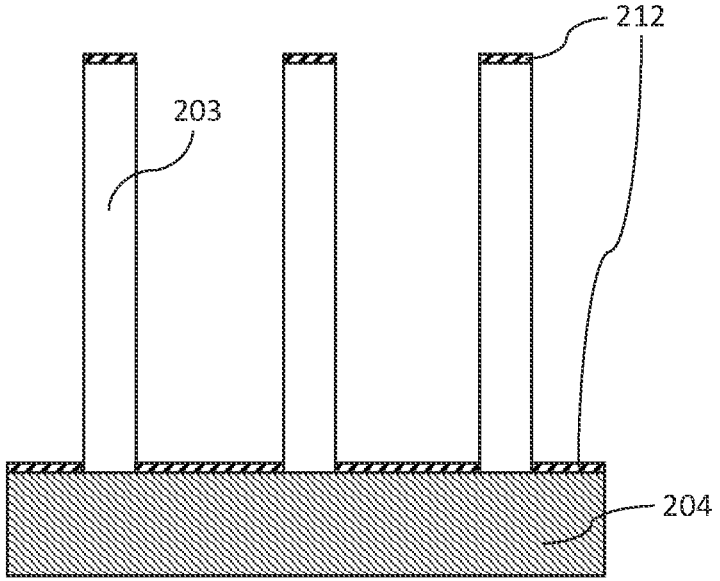
FIG. 2D is a diagram showing an example of a cross-sectional shape of the sample in the plasma processing method according to Example 2 of the present invention.

In this case, for example, if reactive ion etching (RIE) is performed using a gas system mainly containing $Cl_2$, only the first layer 212 of the hard metal layer 202 protected by the deposition film 206 can be selectively left, and the second layer 211 of the hard metal layer 202 in a direction (corresponding to the second direction) perpendicular to the surface of the base layer 204 can be selectively removed (FIG. 2C). At this time, reactive ion etching (RIE) using a gas system mainly containing $Cl_2$ is superior in carbon removal performance compared to radical etching using a gas system mainly containing $Cl_2$, and therefore the presence or absence of redeposition 205 on the carbon-containing layer 201 does not matter. After that, by removal of the deposition 206, a structure can be formed in which only the first layer 212 of the hard metal layer 202 in the horizontal direction (corresponding to the first direction) with respect to the surface of the base layer 204 is selectively left (FIG. 2D).

The second embodiment can be summarized as follows. That is, the second embodiment provides a plasma processing method in which the metal-containing film (202, 212, 211) formed on the formed pattern (the pattern of the pillar structures 203) and covered with the carbon-containing film (201) is plasma-etched, in which after depositing the deposition film (206) on the metal-containing film (first layer 212 of 202), the metal-containing film (the second layer 211 of 202) is removed by reactive ion etching. In this case, after depositing the deposition film (206), the metal-containing layer (second layer 211 of 202) on the side walls of the pattern (203) is removed by reactive ion etching.

As shown above, the deposition process of the thin film deposition film 206 by highly anisotropic deposition and the reactive ion etching (RIE) are appropriately utilized so that only the hard metal layer (second layer 211) in the direction perpendicular to the surface of the base layer 204 can be selectively removed.

Third Embodiment (Example 3)

FIGS. 3A to 3D are diagrams showing examples of three-dimensional cross-sectional shapes of a sample in a plasma processing method according to Example 3 of the present invention.

Figure 3A:
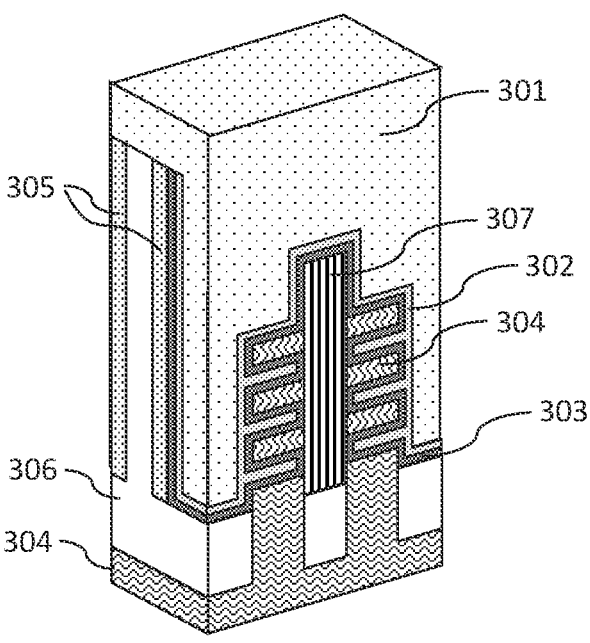
FIG. 3A is a diagram showing an example of a three-dimensional cross-sectional shape of a sample in a plasma processing method according to Example 3 of the present invention.
Figure 3B:
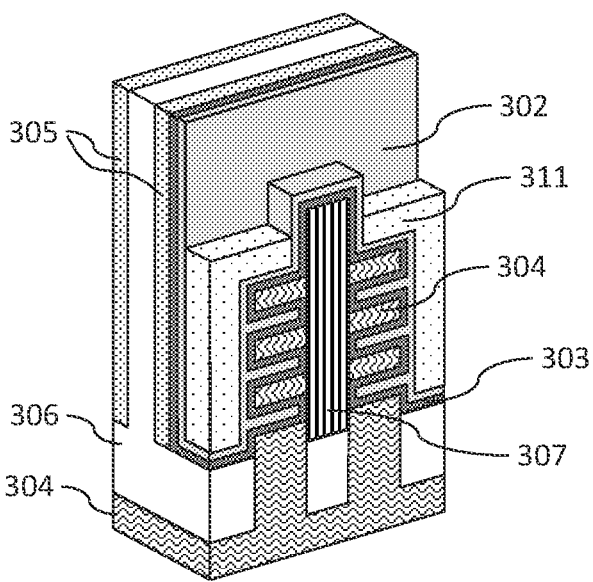
FIG. 3B is a diagram showing an example of a three-dimensional cross-sectional shape of the sample in a plasma processing method according to Example 3 of the present invention.

FIG. 3A shows an example of a GAA-forksheet structure in an FET (Field effect transistor) with a GAA (Gate All Around) structure. A GAA-forksheet structure includes carbon mask layer 301, a WFM (work function metal) layer 302, a hi-k film (high dielectric constant film) 303, a Si layer 304, a low-k film (low dielectric constant film) 305, a $SiO_2$ layer (silicon oxide layer) 306, and a plug portion (metal portion) 307. In this state, a carbon mask layer 311 is etched until a tip of the plug portion 307 is exposed (FIG. 3B). The WFM layer 302 corresponds to the hard metal layers (202, 211, 212) shown in the first and second embodiments. Also, the WFM layer 302 is a layer containing, for example, TiAl (titanium aluminum), TiC (titanium carbide), and WCN, or having a material similar thereto.

Figure 3C:
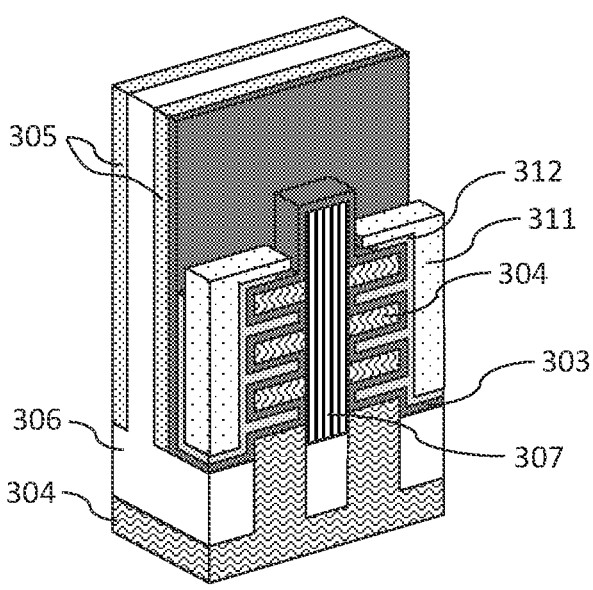
FIG. 3C is a diagram showing an example of a three-dimensional cross-sectional shape of the sample in the plasma processing method according to Example 3 of the present invention.

Now, consider etching an exposed portion of the WFM layer 302. If the WFM layer 302 is etched by a wet process, it is difficult to perform just etching over the entire wafer due to in-plane variations, and there is concern that overetching may occur depending on the location as shown in the WEM layer 312 (FIG. 3C).

Figure 3D:
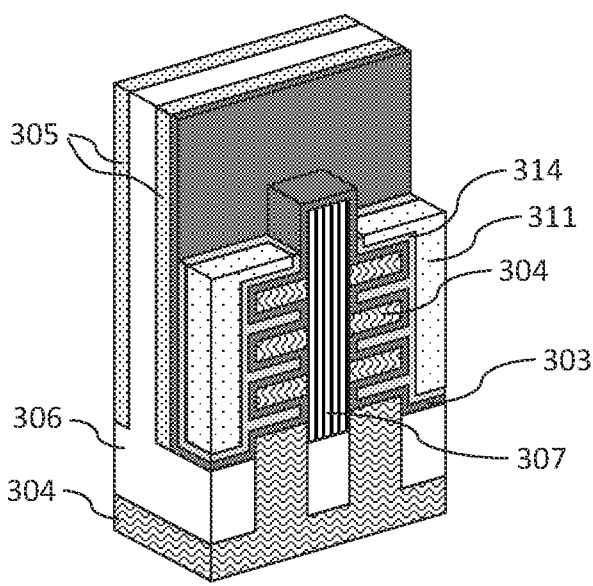
FIG. 3D is a diagram showing an example of a three-dimensional cross-sectional shape of the sample in the plasma processing method according to Example 3 of the present invention.

On the other hand, with the use of removing only the hard metal layer (212) horizontal to the base layer 204 and removing only the hard metal layer (211) perpendicular to the base layer 204 shown in the first embodiment and the second embodiment, a shape shown by the WFM layer 314 in FIG. 3D can be formed over the entire wafer without allowing etching to progress within the pattern even if overetching occurs. That is, the metal-containing layer (202: 212, 211) in an arbitrary direction can be removed by the combination of removing the metal-containing layer (first layer 212 of 202) by radical etching after removing the carbon-containing material according to the first embodiment and removing the metal-containing layer (second layer 211 of 202) on the side walls of the pattern 203 by reactive ion etching (RIE) after depositing the deposition film 206 on the metal-containing layer (first layer 212 of 202) according to the second embodiment.

Fourth Embodiment (Example 4)

FIGS. 4A to 4D are diagrams showing examples of shapes of a sample in a plasma processing method according to Example 4 of the present invention.

Figure 4A:
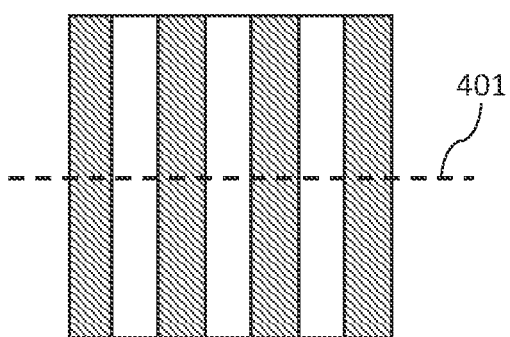
FIG. 4A is a diagram showing an example of a cross-sectional shape of a sample in a plasma processing method according to Example 4 of the present invention.
Figure 4B:
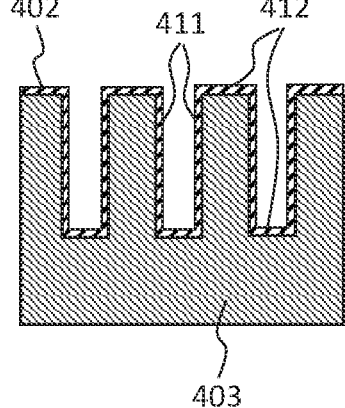
FIG. 4B is a diagram showing an example of a cross-sectional shape of the sample in the plasma processing method according to Example 4 of the present invention.
Figure 4C:
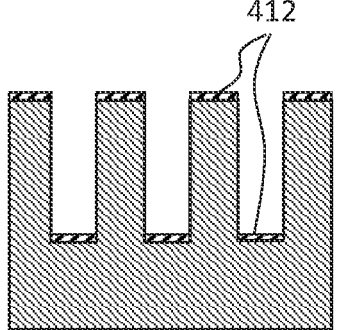
FIG. 4C is a diagram showing an example of a cross-sectional shape of the sample in the plasma processing method according to Example 4 of the present invention.

FIG. 4A is an example of a top view of a line pattern, and FIG. 4B is an example of a cross-sectional shape of a dotted line portion 401 in FIG. 4A. The sample shown in FIG. 4B includes a grooved insulating layer 403 made of SiOx and a hard metal layer (metal-containing layer) 402 made of TiN, TaN, or the like. The hard metal layer (metal-containing layer) 402 includes a first layer 412 formed in a first direction and a second layer 411 formed in a second direction crossing the first direction. In this example, as shown in the second embodiment, only the hard metal layer (second layer 411) on the side wall of a trench can be removed and a hard metal layer 412 can be formed on only a bottom and a top of the trench by appropriately utilizing the deposition process of the thin film due to highly anisotropic deposition and reactive ion etching (RIE) (FIG. 4C).

Figure 4D:
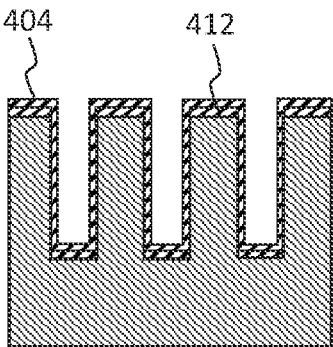
FIG. 4D is a diagram showing an example of a cross-sectional shape of the sample in the plasma processing method according to Example 4 of the present invention.

In this case, a hard metal layer 404 made of TiN, TaN, etc., is further formed so that the hard metal layer on only the side wall can be thinned as compared with the trench bottom (FIG. 4D).

With the use of the above method, when a wiring is buried in the trench, the wiring whose width can be secured while protecting the bottom, and which is highly reliable and low in resistance can be formed.

Fifth Embodiment (Example 5)

FIGS. 5A to 5D are diagrams showing examples of shapes of a sample in a plasma processing method according to Example 5 of the present invention.

Figure 5A:
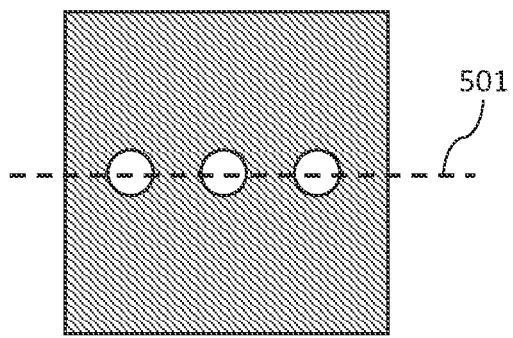
FIG. 5A is a diagram showing an example of a cross-sectional shape of a sample in a plasma processing method according to Example 5 of the present invention.
Figure 5B:
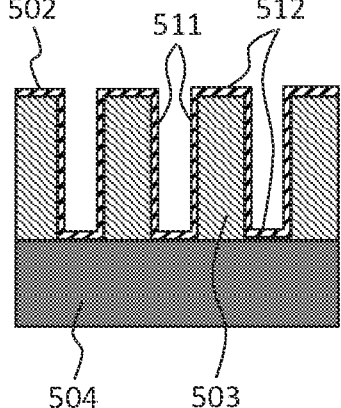
FIG. 5B is a diagram showing an example of a cross-sectional shape of the sample in the plasma processing method according to Example 5 of the present invention.
Figure 5C:
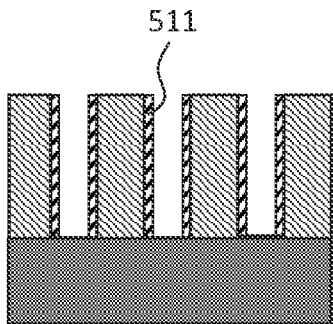
FIG. 5C is a diagram showing an example of a cross-sectional shape of the sample in the plasma processing method according to Example 5 of the present invention.

FIG. 5A is an example of a top view of a hole pattern, and FIG. 5B is an example of the cross-sectional shape of a dotted line portion 501 in FIG. 5A. The sample shown in FIG. 5B includes a metal layer 504, a grooved insulating layer 503 made of SiOx, and a hard metal layer 502 made of TiN, TaN, or the like. The hard metal layer (metal-containing layer) 502 includes a first layer 512 formed in a first direction, and a second layer 511 formed in a second direction crossing the first direction. In this example, as shown in the first embodiment, only the hard metal layer (512) on the bottom and top of the hole can be removed by appropriately using a redeposition during etching of the carbon-containing layer and radical etching, and the metal layer 511 can be formed on only the side walls of the hole (FIG. 5C).

Figure 5D:
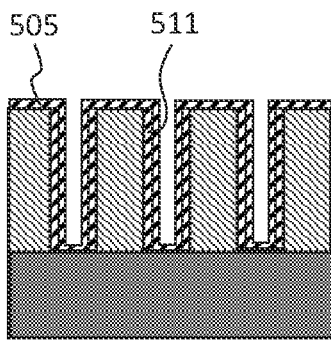
FIG. 5D is a diagram showing an example of a cross-sectional shape of the sample in the plasma processing method according to Example 5 of the present invention.

In this example, a hard metal layer 505 made of TiN, TaN, etc., is further formed so that the hard metal layer can be thinned on only the bottom of the hole with respect to the side wall (FIG. 5D).

With the use of the above method, when a via wiring is buried in the holes, the via wiring that reduces a contact resistance of the bottom and is highly reliable and low in resistance can be formed while protecting the side walls.

Sixth Embodiment

Figure 6:
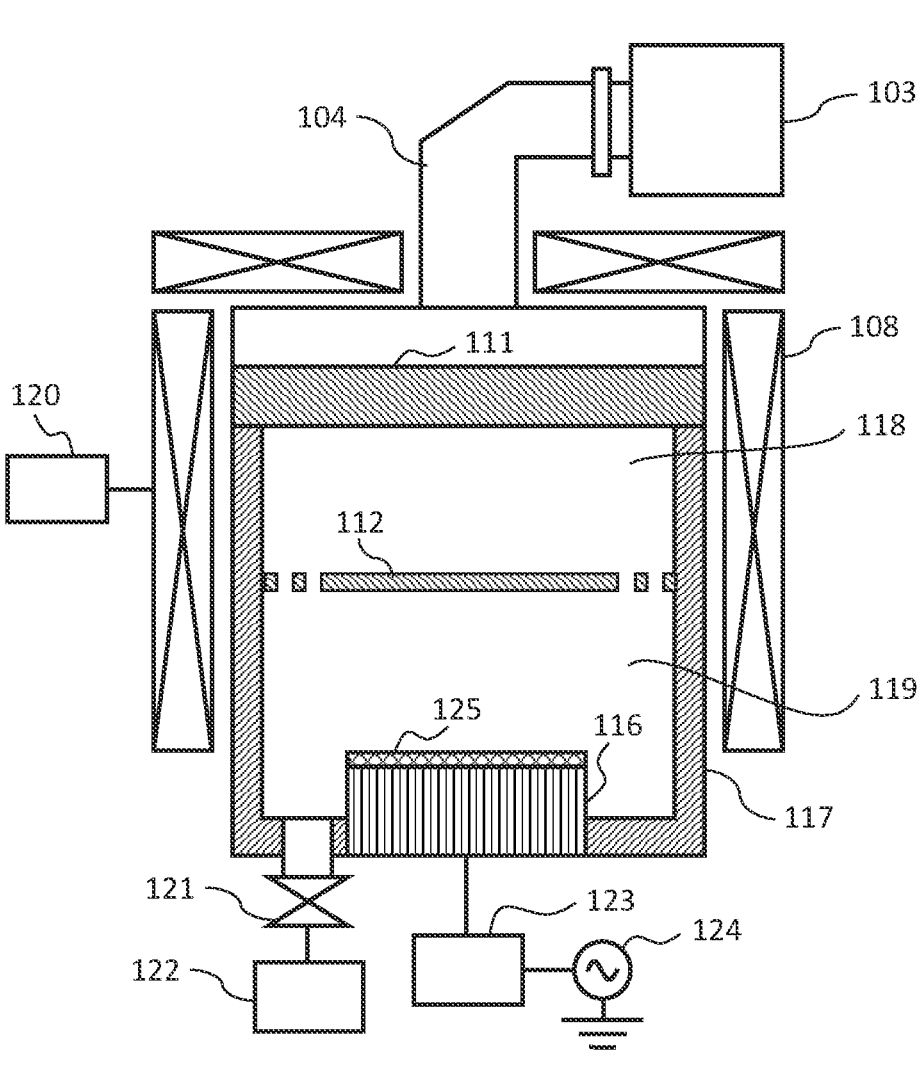
FIG. 6 is a cross-sectional view of a schematic overall configuration of a plasma processing device according to a sixth embodiment of the present invention.

FIG. 6 shows a schematic cross-sectional view of the overall configuration of a plasma processing device according to a sixth embodiment of the present invention. In the plasma processing device of the present embodiment, plasma can be generated in a vacuum processing chamber 117 by an electron cyclotron resonance ECR) between a 2.45 GHz microwave supplied from a magnetron 103, which is a radio frequency power supply, to a vacuum processing chamber 117 through a waveguide 104 and a dielectric window 111, and a magnetic field generated by a solenoid coil 108, which is a magnetic field forming mechanism. Such a plasma processing device is called an ECR plasma processing device.

A radio frequency power supply 124 is connected through a matching device 123 to a sample 125 placed on a sample table 116. The radio frequency power supply 124 provides a microwave radio frequency power for generating plasma in the processing chamber 117. The inside of the vacuum processing chamber 117 is connected to a pump 122 through a valve 121, and an internal pressure can be adjusted by opening the valve 121.

The present plasma processing device also includes a dielectric shielding part (also called a shield plate) 112 inside the vacuum processing chamber 117. The shielding part 112 is disposed above the sample table 116. The shielding part 112 divides an inside of the vacuum processing chamber 117 into a first region 118 and a second region 119.

The plasma processing device used in the present embodiment has a characteristic of being able to generate plasma near a plane with a magnetic field strength of 0.0875 T when a microwave frequency is 2.45 GHz. Therefore, when a magnetic field is adjusted so that a plasma generation region is positioned (in a first region 118) between the shielding part 112 and the dielectric window 111, plasma can be generated on the dielectric window 111 side of the shielding part 112, and generated ions can hardly pass through the shielding part 112 (that is, the shielding part 112 shields the incidence of the ions to the sample table 116). Therefore, the sample 125 can be irradiated only with the radials. At this time, in the sample 125 undergoes radical etching, which is isotropic etching mainly due to surface reactions caused only by radicals.

On the other hand, if the magnetic field is adjusted so that the plasma generation region is located between the shielding part 112 and the sample 125 (second region 119), the plasma can be generated on the sample 125 side from the shielding part 112, and both the ions and radicals can be supplied to sample 125. At this time, reactive ion etching (RIE), which is anisotropic etching using ion-assisted reaction, which promotes radical reaction by ions, progresses in the sample 125.

The control device 120 can be used to adjust or switch (upper or lower) a height position of the plasma generation region with respect to a height position of the shielding part 112, and to adjust a period of holding each height position. That is, the control device 120 can selectively perform one control to generate plasma above the shield plate 112 or the other control to generate plasma below the shield plate 112. One control is to generate plasma above the shield plate 112 by controlling a magnetic field formation mechanism so that the position of a magnetic flux density for microwave and electron cyclotron resonance is above the shield plate 112. The other control is to generate plasma below the shield plate 112 by controlling the magnetic field forming mechanism so that the position of the magnetic flux density is below the shield plate 112.

With the use of the plasma processing device according to the present embodiment, a process using both of reactive ion etching (RIE) and the radical etching shown in the first embodiment and the third embodiment can be efficiently implemented.

The above-described embodiments have been described in detail for easy understanding of the present invention, and are not necessarily limited to those having all the described configurations. Also, part of the configuration of one embodiment can be replaced with the configuration of another embodiment, and the configuration of another embodiment can be added to the configuration of one embodiment. Moreover, a part of the configuration of each embodiment can be added, deleted, or replaced with another configuration.

REFERENCE SIGNS LIST

103: magnetron, 104: waveguide, 108: solenoid coil, 111: dielectric window, 112: shielding part, 116: sample table, 117: vacuum processing chamber, 118: first region, 119: second region, 120: control device, 121: valve, 122: pump, 123: matching device, 124: radio frequency power supply, 125: sample

The invention claimed is:

1. A plasma processing method for plasma etching a metal-containing film formed on a formed pattern and covered with a carbon-containing film, comprising:

removing the carbon-containing film by etching to expose the metal-containing film, wherein the removing by etching of the carbon-containing film causes a portion of the removed carbon-containing film to be redeposited on a side wall portion of the metal-containing film; and after the removing of the carbon-containing film, selectively removing only portions of the metal-containing film which are disposed horizontally with respect to a base layer of the formed pattern by etching with only radicals generated from plasma.

2. The plasma processing method according to claim 1, wherein a metal-containing layer on a side wall of the pattern is removed by reactive ion etching after depositing a deposition film.

3. The plasma processing method according to claim 1, wherein the metal-containing film contains Ti, Ta, Al, Co, Ru, Cu, Mo, In, TiN, TaN, TiO, or AlO.

4. The plasma processing method according to claim 1, wherein the metal-containing film is a film of a work-function metal layer in an FET (field effect transistor) with a GAA (gate all around) structure.

5. The plasma processing method according to claim 4, wherein the work-function metal layer is a layer containing TiAl, TiC, or WCN.

6. The plasma processing method according to claim 1, wherein the metal-containing film is removed using a plasma processing device comprising:

a processing chamber in which a sample is plasma-processed;

a radio frequency power supply that supplies a microwave radio frequency power to generate plasma;

a magnetic field forming mechanism that forms a magnetic field in the processing chamber;

a sample table on which the sample is placed;

a shield plate that is disposed above the sample table for shielding ions from entering the sample table; and a control device that selectively performs one control for generating plasma above the shield plate and the other control for generating plasma below the shield plate, wherein the one control controls the magnetic field forming mechanism so that a position of a magnetic flux density for electron cyclotron resonance with the microwave is above the shield plate, and the other control removes the metal-containing film by using the plasma processing device that controls the magnetic field forming mechanism so that the position of the magnetic flux density is below the shield plate.

7. A plasma processing method for plasma etching a metal-containing film formed on a formed pattern and covered with a carbon-containing film, comprising:

depositing a deposition film on only portions of the metal-containing film which are disposed horizontally with respect to a base layer of the formed pattern, using a thin film process; and after depositing the deposition film on the metal-containing film, selectively removing only portions of the metal-containing film which are disposed vertically with respect to a base layer of the formed pattern by reactive ion etching.

8. The plasma processing method according to claim 7, wherein the metal-containing film contains Ti, Ta, Al, Co, Ru, Cu, Mo, In, TiN, TaN, TiO, or AlO.

9. The plasma processing method according to claim 7, wherein the metal-containing film is a film of a work-function metal layer in an FET (field effect transistor) with a GAA (gate all around) structure.

10. The plasma processing method according to claim 7, wherein the metal-containing film is removed using a plasma processing device comprising:

a processing chamber in which a sample is plasma-processed;

a radio frequency power supply that supplies a microwave radio frequency power to generate plasma;

a magnetic field forming mechanism that forms a magnetic field in the processing chamber;

a sample table on which the sample is placed;

a shield plate that is disposed above the sample table for shielding ions from entering the sample table; and a control device that selectively performs one control for generating plasma above the shield plate and the other control for generating plasma below the shield plate, wherein the one control controls the magnetic field forming mechanism so that a position of a magnetic flux density for electron cyclotron resonance with the microwave is above the shield plate, and the other control removes the metal-containing film by using the plasma processing device that controls the magnetic field forming mechanism so that the position of the magnetic flux density is below the shield plate.

* * * * *